United States Patent
Hwang et al.

(10) Patent No.: US 9,397,120 B2
(45) Date of Patent: Jul. 19, 2016

(54) ARRAY SUBSTRATE AND A DISPLAY DEVICE HAVING THE SAME

(71) Applicant: SAMSUNG DISPLAY CO., LTD., Yongin, Gyeonggi-Do (KR)

(72) Inventors: Min-Ha Hwang, Seoul (KR);
Woong-Kwon Kim, Cheonan-si (KR);
In-Woo Kim, Asan-si (KR);
Seong-Young Lee, Anyang-si (KR);
Kweon-Sam Hong, Asan-si (KR);
Dong-Hyun Yoo, Asan-si (KR);
Beom-Hee Han, Gwangju-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/224,779

(22) Filed: Mar. 25, 2014

(65) Prior Publication Data
US 2015/0129963 A1 May 14, 2015

(30) Foreign Application Priority Data
Nov. 14, 2013 (KR) .................. 10-2013-0138548

(51) Int. Cl.
| H01L 21/00 | (2006.01) |
| H01L 21/84 | (2006.01) |
| G02F 1/1345 | (2006.01) |
| H04N 5/66 | (2006.01) |
(Continued)

(52) U.S. Cl.
CPC .......... *H01L 27/124* (2013.01); *H01L 29/41733* (2013.01)

(58) Field of Classification Search
CPC ....... H01L 29/785; H01L 27/86; H01L 29/10; H01L 21/82343; H01L 21/02532; H01L 29/165; H01L 27/05; H01L 21/02; H01L 27/124; H01L 29/41733; H01L 27/3276; H01L 27/1288; H01L 27/1259; H01L 27/156; H01L 29/4908; H01L 2251/568; H01L 27/3244; H01L 29/42384; H01L 27/0207; H01L 27/3211; H01L 27/14636; H01L 51/5203; H01L 21/707; H01L 23/528; H01L 27/32
USPC .................................. 257/342–352
See application file for complete search history.

(56) References Cited

U.S. PATENT DOCUMENTS

| 8,236,628 B2 * | 8/2012 | Liu ........................ H01L 27/124 257/E21.561 |
| 2010/0225831 A1 * | 9/2010 | Takeuchi .......... G02F 1/136213 348/739 |
| 2010/0225859 A1 * | 9/2010 | Tsai et al. ..................... 349/106 |

(Continued)

FOREIGN PATENT DOCUMENTS

| JP | 3804581 | 5/2006 |
| JP | 2010-282046 | 12/2010 |

(Continued)

*Primary Examiner* — Howard Weiss
*Assistant Examiner* — Nelson Garces
(74) *Attorney, Agent, or Firm* — F. Chau & Associates, LLC (57) ABSTRACT

An array substrate includes a substrate, a plurality of gate lines extending in a first direction on the substrate, a plurality of data lines including first and second data line pairs separated by cutting portions and a plurality of active patterns electrically connected to the first and second data line pairs. The data lines extend in a second direction crossing the first direction. The active patterns overlap the cutting portion and overlap a first gate line.

12 Claims, 9 Drawing Sheets

(51) Int. Cl.
   *H01L 27/12* (2006.01)
   *H01L 29/417* (2006.01)

(56) References Cited

U.S. PATENT DOCUMENTS

2013/0070175 A1* 3/2013 Chen .................. G02F 1/136286
                                                        349/43

2013/0215372 A1* 8/2013 Oke ...................... G02F 1/1345
                                                       349/149

FOREIGN PATENT DOCUMENTS

| JP | 5214613 | 3/2013 |
| KR | 10-0505984 | 8/2005 |
| KR | 1020070112577 | 11/2007 |
| KR | 10-0925453 | 11/2009 |

* cited by examiner

ARRAY SUBSTRATE AND A DISPLAY DEVICE HAVING THE SAME

CROSS-REFERENCE TO RELATED APPLICATION

This application claims priority under 35 U.S.C. §119 to Korean Patent Application No. 10-2013-0138548, filed on Nov. 14, 2013, the disclosure of which is incorporated by reference herein in its entirety.

TECHNICAL FIELD

The invention relates to an array substrate and a display device having the same.

DISCUSSION OF THE RELATED ART

A liquid crystal display panel may include an array substrate, an opposing substrate facing the array substrate and a liquid crystal display layer disposed between the array substrate and the opposing substrate. Control signals for a plurality of pixel electrodes may be applied to the array substrate through signal lines. The pixel electrodes may be disposed on a display area of the array substrate.

Display technologies have been developed to implement a higher pixel resolution, e.g., an ultra high definition ("UHD") display. For example, a liquid crystal display device having a pixel resolution of 3840×2160 may apply upper data signals to 1080 data lines disposed at an upper portion of the display area and may apply lower data signals to 1080 data lines disposed at a lower portion of the display area.

However, if the upper data lines and the lower data lines are separately driven, luminance at a boundary portion between the upper data lines and the lower data lines may decrease and an undesired horizontal line may be seen in a display image, thereby reducing a display quality of the liquid crystal display panel.

SUMMARY

An exemplary embodiment of the invention provides an array substrate capable of reducing an undesired horizontal line in a display image while separately driving upper data lines and lower data lines.

In addition, an exemplary embodiment of the invention provides a display device having the array substrate.

In an exemplary embodiment of the invention, an array substrate includes a substrate, a plurality of gate lines extending in a first direction on the substrate, a plurality of data lines including first and second data line pairs separated by cutting portions and a plurality of active patterns electrically connected to the first and second data line pairs. The data lines extend in a second direction crossing the first direction. The active patterns overlap the cutting portion and overlap a first gate line.

In an exemplary embodiment of the invention, a first cutting portion may overlap the first gate line.

In an exemplary embodiment of the invention, a second cutting portion spaced apart from the first cutting portion may overlap a second gate line spaced apart from the first gate line.

In an exemplary embodiment of the invention, a second cutting portion spaced apart from the first cutting portion may overlap the first gate line.

In an exemplary embodiment of the invention, the first gate line may overlap the first data line or the second data line of one of the first and second data line pairs.

In an exemplary embodiment of the invention, in one of the first and second data line pairs, the first gate line may overlap only one of the first data line or the second data line.

In an exemplary embodiment of the invention, the first gate line may not be overlapped by the first data line and the second data line of one of the first and second data line pairs.

In an exemplary embodiment of the invention, a distance between the first data line and the second data line of one of the first and second data line pairs separated by one of the cutting portions may be less than 70 μm.

In an exemplary embodiment of the invention, a width of one of the active patterns in the first direction may be greater than a width of one of the data lines in the first direction.

In an exemplary embodiment of the invention, a length of one of the active patterns in the second direction may be greater than a width of a portion of the first gate line crossing one of the data lines in the first direction.

In an exemplary embodiment of the invention, the array substrate may further include a plurality of pixel electrodes electrically connected to the gate lines and the data lines. Two data lines adjacent to each other in the first direction may be electrically connected to different pixel electrodes in a pixel area between the two data lines.

In an exemplary embodiment of the invention, odd-numbered data lines along the first direction may be electrically connected to first pixel electrodes disposed at a first side of the odd-numbered data lines. Even-numbered data lines along the first direction may be electrically connected to second pixel electrodes disposed at a second side of the even-numbered data lines. The second side of the even-numbered data lines may be opposite to the first side of the odd-numbered data lines.

In an exemplary embodiment of the invention, the array substrate may further include a plurality of thin film transistors electrically connected to the gate lines and the data lines. At least one of the thin film transistors may include a source electrode electrically connected to the first data line or the second data line of one of the first and second data line pairs, a channel pattern overlapping the source electrode on one of the gate lines and a drain electrode overlapping the channel pattern.

In an exemplary embodiment of the invention, the channel pattern may be disposed in a same layer as one of the active patterns.

In an exemplary embodiment of the invention, the channel pattern may be disposed in a different layer from one of the active patterns.

In an exemplary embodiment of the invention, a display device includes an array substrate including a plurality of gate lines and a plurality of data lines crossing the gate lines, a gate driving part configured to apply gate signals to the gate lines, a first data driving part and a second data driving part. The data lines include first and second data line pairs separated by cutting portions. The first data driving part is configured to apply first data signals to the first data lines of the first and second data line pairs. The second data driving part is configured to apply second data signals to the second data lines of the first and second data line pairs. The first data lines and the second data lines of the first and second data line pairs are electrically connected by an active pattern overlapping the cutting portion.

In an exemplary embodiment of the invention, the first data signals and the second data signals may include synchronized data signals.

In an exemplary embodiment of the invention, the cutting portions may be arranged in a bent line along a direction in which the gate lines extend.

In an exemplary embodiment of the invention, the display device may further include a plurality of pixel electrodes arranged in a matrix shape and electrically connected to the gate lines and the data lines.

In an exemplary embodiment of the invention, a length and a width of one of the active patterns may be different than a length and a width of another one of the active patterns.

In an exemplary embodiment of the invention, an array substrate includes a first data line disposed on a substrate; a second data line disposed on the substrate; an active pattern disposed between the first and second data lines and electrically connecting the first and second data lines to each other.

The active pattern may be overlapped by the first and second data lines and a space may be formed between the first and second data lines on the active pattern.

A passivation layer may be disposed in the space.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF THE EMBODIMENTS

Hereinafter, exemplary embodiments of the invention will be described in further detail with reference to the accompanying drawings.

Figure 1:
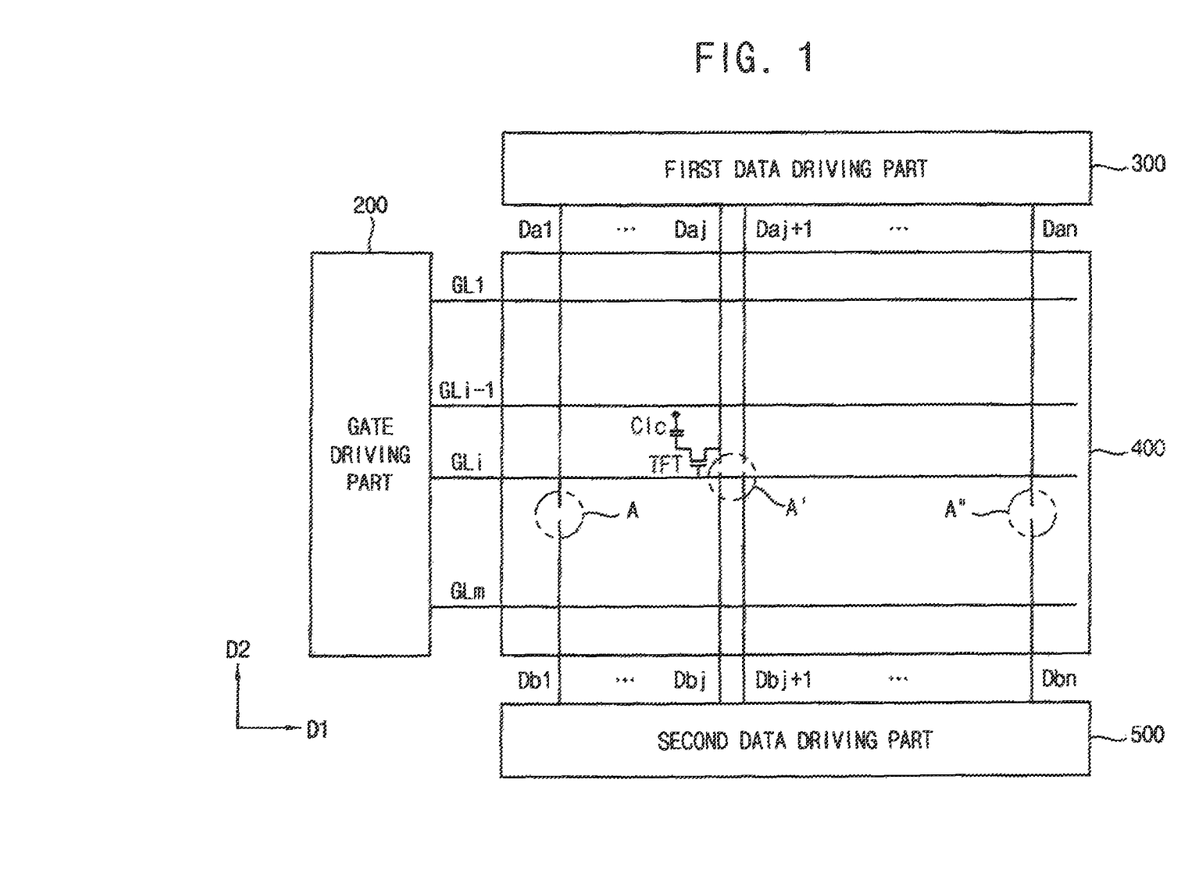
FIG. 1 is a plan view illustrating a display device according to an exemplary embodiment of the invention.

FIG. 1 is a plan view illustrating a display device according to an exemplary embodiment of the invention.

Referring to FIG. 1, a display device according to the present exemplary embodiment may include an array substrate 400, a gate driving part 200, a first data driving part 300 and a second data driving part 500. The array substrate 400 may include a plurality of gate lines GL1 to GLm extending in a first direction D1. The array substrate 400 may include a plurality of data lines Da1 to Dan and Db1 to Dbn extending in a second direction D2 crossing the first direction D1. The data lines Da and Db may be separated by cutting portions A, A' and A". The data lines Da and Db away include first data lines Da1 to Dan electrically connected to the first data driving part 300. The data lines Da and Db may include second data lines Db1 to Dbn electrically connected to the second data driving part 500. For example, a pair of data lines Dj may include a first data line Daj disposed at an upper portion of the array substrate 400 with respect to the cutting portions A, A' and A" and a second data line Dbj disposed at a lower portion of the array substrate 400 with respect to the cutting portions A, A' and A". Hereinafter, the cutting portions A, A' and A" may be referred to as spaces between the first data lines Da1 to Dan and the second data lines Db1 to Dbn.

The array substrate 400 may further include active patterns electrically connecting the first data lines Da to the second data lines Db. In addition, the array substrate 400 may further include switching elements TFT electrically connected to the gate lines GL and the data lines Da and Db. In addition, the array substrate 400 may include pixel electrodes electrically connected to the switching elements TFT. If the display device includes a liquid crystal layer, a liquid crystal capacitor Clc may be generated between a common electrode and the pixel electrodes.

The gate driving part 200 may be configured to generate gate on/off voltages to drive the gate lines GL1 to GLm using a first control signal from a timing control part. The gate driving part 200 may be configured to sequentially output the gate on/off voltages to the gate lines GL1 to GLm. Although the gate driving part 200 is disposed outside the array substrate 400 in FIG. 1, the location of the gate driving part 200 is not limited thereto. In an exemplary embodiment of the invention, the gate driving part 200 may be directly formed on a peripheral area of the array substrate 400. For example, the gate driving part 200 may include a plurality of switching elements simultaneously formed with the switching elements TFT in a display area of the array substrate 400. In an exemplary embodiment of the invention, the gate driving part 200 may be embedded on the array substrate 400 as a tape carrier package ("TCP").

The first data driving part 300 may be disposed on a first side (e.g., an upper side) of the array substrate 400. The second data driving part 500 may be disposed on a second side (e.g., a lower side) of the array substrate 400 opposite to the first side. Although the first data driving part 300 and the second data driving part 500 are disposed outside the array substrate 400 in FIG. 1, the locations of the first and second data driving parts 300 and 500 are not limited thereto. In an exemplary embodiment of the invention, the first data driving part 300 and the second data driving part 500 may be disposed on the array substrate 400.

The first data driving part 300 and the second data driving part 500 may be configured to output data signals to the data lines Da and Db. The data signals may be generated based on a second control signal from the timing control part and a grey scale voltage from a gamma voltage generating part. For example, the first data driving part 300 may be configured to output first data signals to the first data lines Da1 to Dan. The second data driving part 500 may be configured to output second data signals to the second data lines Db1 to Dbn. For example, synchronized data signals may be applied to a pair of the first data line Da and the second data line Db. For example, the first data signal may be applied to a j-th data line Daj of the first data lines at substantially the same time as the second data signal is applied to a j-th data line Dbj of the second data lines. In a similar manner, the first data signal may be applied to a j+1-th data line Daj+1 of the first data lines at substantially the same time as the second data signal is applied to a j+1-th data line Dbj+1 of the second data lines.

The cutting portions A, A' and A" may separate the first data lines Da and the second data lines Db. The cutting portions A, A' and A" may be located in different positions of the data lines in the first direction D1. For example, a first cutting portion A which separates 1st data line Da1 of the first data lines and 1st data line Db1 of the second data lines may be in a different location in the second direction D2 than a second cutting portion A' which separates the j-th data line Daj of the first data lines and the j-th data line Dbj of the second data lines. A third cutting portion A" which separates n-th data line Dan of the first data lines and n-th data line Dbn of the second data line may be in a different location in the second direction D2 than the second cutting portion A'. For example, the cutting portions A, A' and A" may be randomly located in the first direction D1.

As mentioned above, the cutting portions A, A' and A" may be arranged in different positions on the array substrate 400 forming a bent line, thereby reducing an undesired horizontal line that may result if the cutting portions A, A' and A" were arranged in a straight line.

Figure 3A:
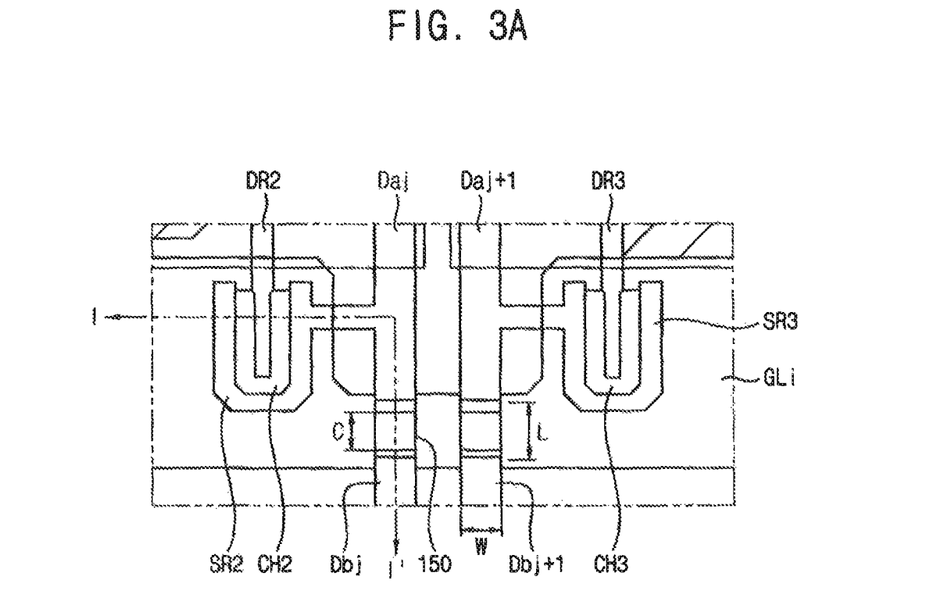
FIG. 3A is an enlarged plan view illustrating a portion "B" of FIG. 2 according to an exemplary embodiment of the invention.

Each pair of the first data lines Da and the second data lines Db may be electrically connected with each other by active patterns overlapping the cutting portions A, A' and A". The active patterns will be described in detail referring to FIG. 3.

Figure 2:
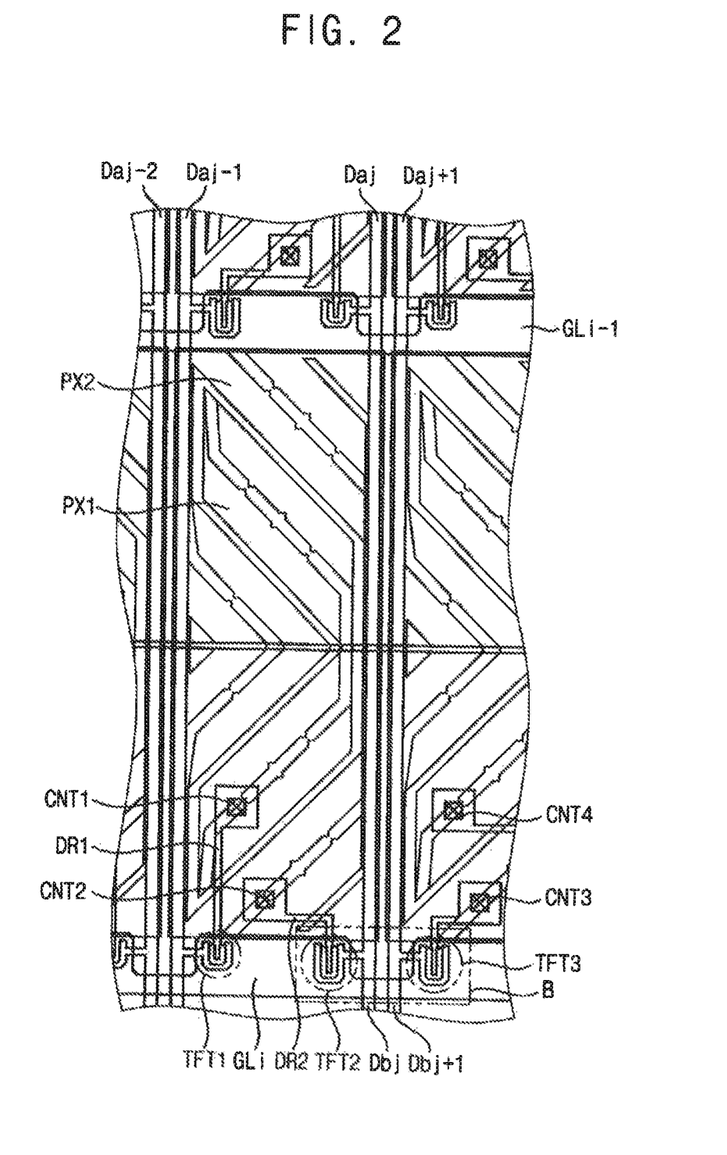
FIG. 2 is a plan view illustrating a portion of an array substrate of FIG. 1, according to an exemplary embodiment of the invention.

FIG. 2 is a plan view illustrating a portion of the array substrate 400 of FIG. 1, according to an exemplary embodiment of the invention.

Referring to FIG. 2, the array substrate 400 may include a plurality of pixel electrodes PX1 and PX2 electrically connected to the gate lines GL and the data lines Da and Db. The pixel electrodes PX1 and PX2 may be arranged in a matrix shape with respect to the gate lines GL and the data lines Da and Db.

The pixel electrodes PX1 and PX2 may be disposed in pixel areas defined by two data lines and two gate lines. For example, a first pixel electrode PX1 and a second pixel electrode PX2 may be disposed in a pixel area surrounded by i−1-th gate line GLi−1 of the gate lines, i-th gate line GLi of the gate lines, j−1-th data line Daj−1 of the first data lines and j-th data line Daj of the first data lines.

The j−1-th data line Daj−1 of the first data lines may be electrically connected to a first switching element TFT1 having a first drain electrode DR1. The first pixel electrode PX1 may contact with the first drain electrode DR1 through a first contact hole CNT1. The j-th data line Daj of the first data lines may be electrically connected to a second switching element TFT2 having a second drain electrode DR2. The second pixel electrode PX2 may contact with the second drain electrode DR2 through a second contact hole CNT2.

In the present exemplary embodiment, odd-numbered data lines Da and Db may be electrically connected to the first pixel electrode PX1 disposed on a right side of the odd-numbered data lines Da and Db by the first switching element TFT1. In addition, even-numbered data lines Da and Db may be electrically connected to the second pixel electrode PX2 disposed on a left side of the even-numbered data lines Da and Db by the second switching element TFT2. The switching elements TFT1 and TFT2 electrically connected to the first pixel electrode PX1 and the second pixel electrode PX2 may be changed in an adjacent pixel area. For example, the j-th data line Daj of the first data lines may be electrically connected to the second pixel electrode PX2 by the second switching element TFT2. A j+1-th data line Daj+1 of the first data lines may be electrically connected to the second pixel electrode PX2 by a third switching element TFT3.

Figure 3B:
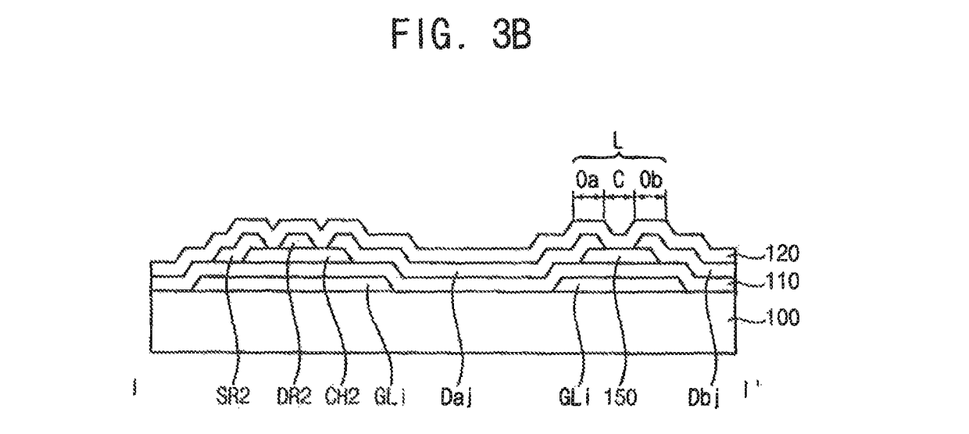
FIG. 3B is a cross-sectional view taken along a line I-I' of FIG. 3A according to an exemplary embodiment of the invention.

FIG. 3A is an enlarged plan view illustrating a portion "B" of FIG. 2, according to an exemplary embodiment of the invention. FIG. 3B is a cross-sectional view taken along a line I-I' of FIG. 3A, according to an exemplary embodiment of the invention.

Referring to FIG. 2, FIG. 3A and FIG. 3B, an array substrate according to the present exemplary embodiment may include a substrate 100, a gate line GLi, a gate insulation layer 110, channel patterns CH2 and CH3, active patterns 150, source electrodes SR2 and SR3, drain electrodes DR2 and DR3, first data lines Daj and Daj+1 and second data lines Dbj and Dbj+1. Hereinafter, j-th data lines Daj and Dbj will be described for ease of description.

The second switching element TFT2 electrically connected to the j-th data line Daj of the first data lines may include the gate line GLi, the gate insulation layer 110, the channel pattern CH2, the source electrode SR2, the drain electrode DR2 and a passivation layer 120. The gate insulation layer 110 may be disposed on the gate line GLi. The channel pattern CH2 may be disposed on the gate insulation layer 110. The source electrode SR2 may partially overlap the channel pattern CH2. The drain electrode DR2 may be spaced apart from the source electrode SR2 and may partially overlap the channel pattern CH2. The passivation layer 120 may cover the source electrode SR2 and the drain electrode DR2.

The active pattern 150 may be disposed on the gate insulation layer 110 in a cutting portion which separates the first data line Daj and the second data line Dbj. The active pattern 150 may partially overlap the first data line Daj and the second data line Dbj. A first overlapping portion Oa of the first data line Daj may overlap the active pattern 150. A second overlapping portion Ob of the second data line Dbj may overlap the active pattern 150. The passivation layer 120 may cover the active pattern 150.

In the present exemplary embodiment, the active pattern 150 may be formed in a same layer as the channel pattern CH2. For example, the active pattern 150 may include the same material as the channel pattern CH2. The active pattern 150 may be formed simultaneously with the channel pattern CH2.

A width W of the active pattern 150 may be substantially the same as widths of the data lines Da and Db. A length L of the active pattern 150 may be greater than a length of the cutting portion C between the first data line Daj and the second data line Dbj. For example, the length L of the active pattern 150 may be substantially the same as a sum of lengths of the first overlapping portion Oa, the second overlapping portion Ob and the cutting portion C. The active pattern 150 may entirely overlap the gate line GLi. The first overlapping portion Oa and the second overlapping portion Ob may overlap the gate line GLi.

As mentioned above, the first data line Daj and the second data line Dbj separated by the cutting portion C may be electrically connected with each other through the active pattern 150, thereby reducing a difference in pixel signals applied to the pixel electrodes adjacent to the cutting portion C.

For example, in the case that the cutting portion 150 does not include the active pattern 150, if a first data signal having a relatively high voltage is applied to a pixel electrode disposed at an upper left side of the cutting portion C through the first data line Daj and a second data signal having a relatively low voltage is applied to a pixel electrode disposed at a lower left side of the cutting portion C through the second data line Dbj, the difference between the first data signal and the second data signal applied to the upper left pixel electrode and the lower left pixel electrode may be sufficiently large to create a difference of luminance in an upper left pixel area and in a lower left pixel area of the cutting portion C.

In contrast, if the first data line Daj is electrically connected to the second data line Dbj through the active pattern 150, the first data signal having the relatively high voltage and the second data signal having the relatively low voltage may be adjusted to lessen the difference between the data signals applied to the upper left pixel electrode and the lower left pixel electrode. Accordingly, a difference of luminance in the upper left pixel area and in the lower left pixel area may be reduced, thereby increasing a display quality of the display device.

Figure 4A:
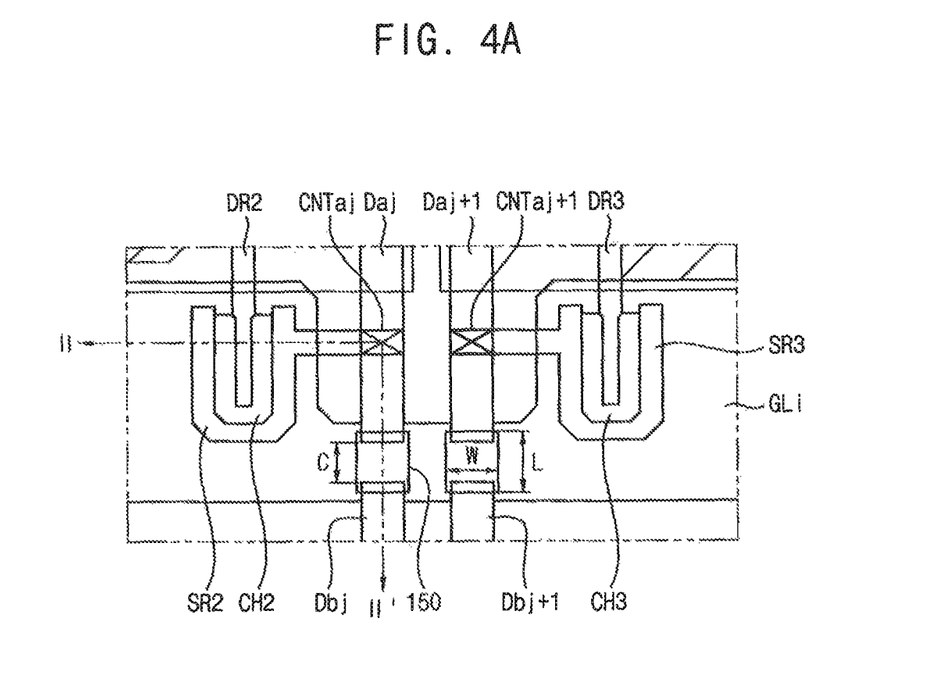
FIG. 4A is an enlarged plan view illustrating an array substrate according to an exemplary embodiment of the invention.
Figure 4B:
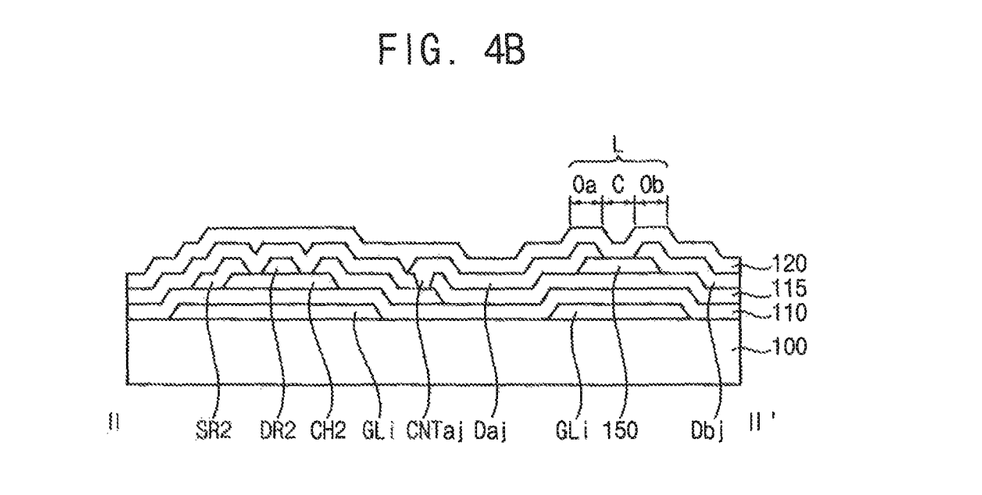
FIG. 4B is a cross-sectional view taken along a line II-II' of FIG. 4A according to an exemplary embodiment of the invention.

FIG. 4A is an enlarged plan view illustrating an array substrate according to an exemplary embodiment of the invention. FIG. 4B is a cross-sectional view taken along a line II-II' of FIG. 4A, according to an exemplary embodiment of the invention.

Referring to FIG. 2, FIG. 4A and FIG. 4B, an array substrate according to the present exemplary embodiment may include a substrate 100, a gate line GTi, a gate insulation layer 110, channel patterns CH2 and CH3, active patterns 150, source electrodes SR2 and SR3, drain electrodes DR2 and DR3, first data lines Daj and Daj+1 and second data lines Dbj and Dbj+1 Hereinafter, j-th data lines Daj and Dbj will be described for ease of description.

The second switching element TFT2 electrically connected to the j-th data line Daj of the first data lines may include the gate line GLi, the gate insulation layer 110, the channel pattern CH2, the source electrode SR2, the drain electrode DR2, an intermediate insulation layer 115 and a passivation layer 120. The gate insulation layer 110 may be disposed on the gate line GLi. The channel pattern CH2 may be disposed on the gate insulation layer 110. The source electrode SR2 may partially overlap the channel pattern CH2. The drain electrode DR2 may be spaced apart from the source electrode SR2 and may partially overlap the channel pattern CH2. The intermediate insulation layer 115 may cover the source electrode SR2 and the drain electrode DR2. The passivation layer 120 may be disposed on the intermediate insulation layer 115.

The first data line Daj may be electrically connected to the source electrode SR2 through a contact hole CNTaj defined in the intermediate insulation layer 115.

The active pattern 150 may be disposed on the intermediate insulation layer 115 in a cutting portion which separates the first data line Daj and the second data line Dbj. The active pattern 150 may partially overlap the first data line Daj and the second data line Dbj. A first overlapping portion Oa of the first data line Daj may overlap the active pattern 150. A second overlapping portion Ob of the second data line Dbj may overlap the active pattern 150. The passivation layer 120 may cover the active pattern 150.

In the present exemplary embodiment, the active pattern 150 may be formed in a different layer from the channel pattern CH2. For example, the active pattern 150 may be formed on the intermediate layer 115 as an island pattern using an additional mask.

A width W of the active pattern 150 may be greater than widths of the data lines Da and Db. A length L of the active pattern 150 may be greater than a length of the cutting portion C between the first data line Daj and the second data line Dbj. For example, the length L of the active pattern 150 may be substantially the same as a sum of lengths of the first overlapping portion Oa, the second overlapping portion Ob and the cutting portion C. The active pattern 150 may entirely overlap the gate line GLi. The first overlapping portion Oa and the second overlapping portion Ob may overlap the gate line GLi.

As mentioned above, the first data line Daj and the second data line Dbj separated by the cutting portion C may be electrically connected with each other through the active pattern 150, thereby reducing a difference in pixel signals applied to the pixel electrodes adjacent to the cutting portion C.

Figure 5A:
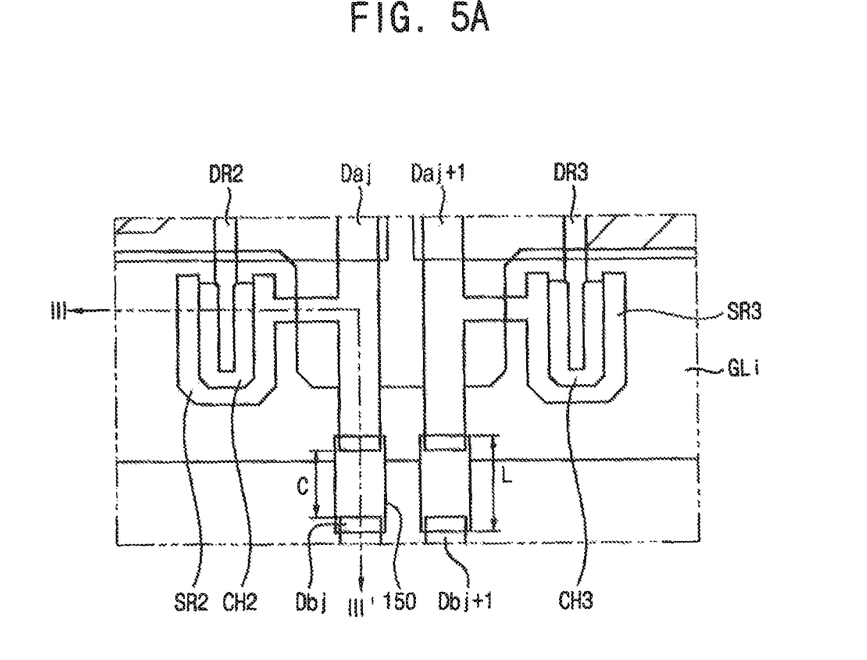
FIG. 5A is an enlarged plan view illustrating an array substrate according to an exemplary embodiment of the invention.
Figure 5B:
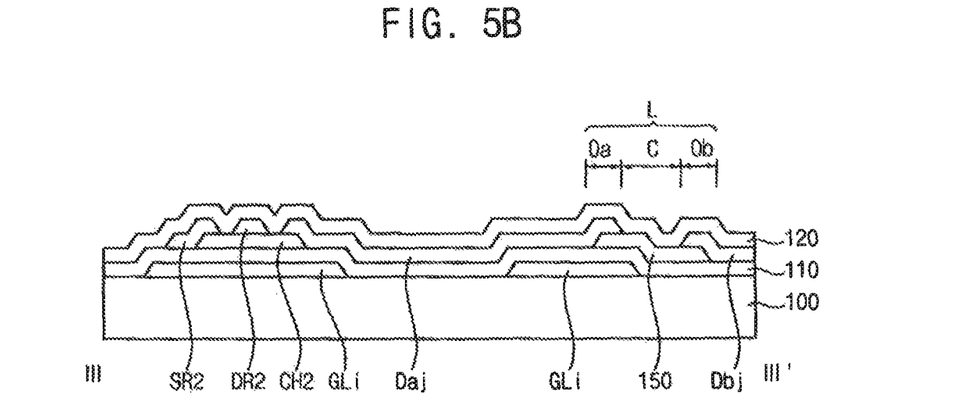
FIG. 5B is a cross-sectional view taken along a line III-III' of FIG. 5A according to an exemplary embodiment of the invention.

FIG. 5A is an enlarged plan view illustrating an array substrate according to an exemplary embodiment of the invention. FIG. 5B is a cross-sectional view taken along a line III-III' of FIG. 5A, according to an exemplary embodiment of the invention.

Referring to FIG. 2, FIG. 5A and FIG. 5B, an array substrate according to the present exemplary embodiment may include a substrate 100, a gate line GLi, a gate insulation layer 110, channel patterns CH2 and CH3, active patterns 150, source electrodes SR2 and SR3, drain electrodes DR2 and DR3, first data lines Daj and Daj+1 and second data lines Dbj and Dbj+1. Hereinafter, j-th data lines Daj and Dbj will be described for ease of description.

The second switching element TFT2 electrically connected to the j-th data line Daj of the first data lines may include the gate line GLi, the gate insulation layer 110, the channel pattern CH2, the source electrode SR2, the drain electrode DR2 and a passivation layer 120. The gate insulation layer 110 may be disposed on the gate line GLi. The channel pattern CH2 may be disposed on the gate insulation layer 110. The source electrode SR2 may partially overlap the channel pattern CH2. The drain electrode DR2 may be spaced apart from the source electrode SR2 and may partially overlap the channel pattern CH2. The passivation layer 120 may cover the source electrode SR2 and the drain electrode DR2.

The active pattern 150 may be disposed on the gate insulation layer 110 in a cutting portion which separates the first data line Daj and the second data line Dbj. The active pattern 150 may partially overlap the first data line Daj and the second data line Dbj. A first overlapping portion Oa of the first data line Daj may overlap the active pattern 150. A second overlapping portion Ob of the second data line Dbj may overlap the active pattern 150. The passivation layer 120 may cover the active pattern 150.

In the present exemplary embodiment, the active pattern 150 may be formed in a same layer as the channel pattern CH2. For example, the active pattern 150 may include the same material as the channel pattern CH2. The active pattern 150 may be formed simultaneously with the channel pattern CH2 using a single mask.

A length L of the active pattern 150 may be greater than a length of the cutting portion C between the first data line Daj and the second data line Dbj. For example, the length L of the active pattern 150 may be substantially the same as a sum of lengths of the first overlapping portion Oa, the second overlapping portion Ob and the cutting portion C.

The active pattern 150 may partially overlap the gate line GLi. The first overlapping portion Oa may entirely overlap the gate line GLi. The second overlapping portion Ob may not overlap the gate line GLi.

In the present exemplary embodiment, the length of the cutting portion C may be greater than the length of the cutting portion C illustrated in FIG. 4A and FIG. 4B. For example, the length of the cutting portion C in the present exemplary embodiment may be equal to or less than about 70 μm.

As mentioned above, the first data line Daj and the second data line Dbj separated by the cutting portion C may be electrically connected with each other through the active pattern 150, thereby reducing a difference in pixel signals applied to the pixel electrodes adjacent to the cutting portion C.

In addition, an overlapping area between the gate line GLi, the first data line Daj, the second data line Dbj and the active pattern 150 may be configured as described with reference to FIGS. 5A and 5B, thereby reducing the difference in pixel signals applied to the pixel electrodes adjacent to the cutting portion C.

Figure 6A:
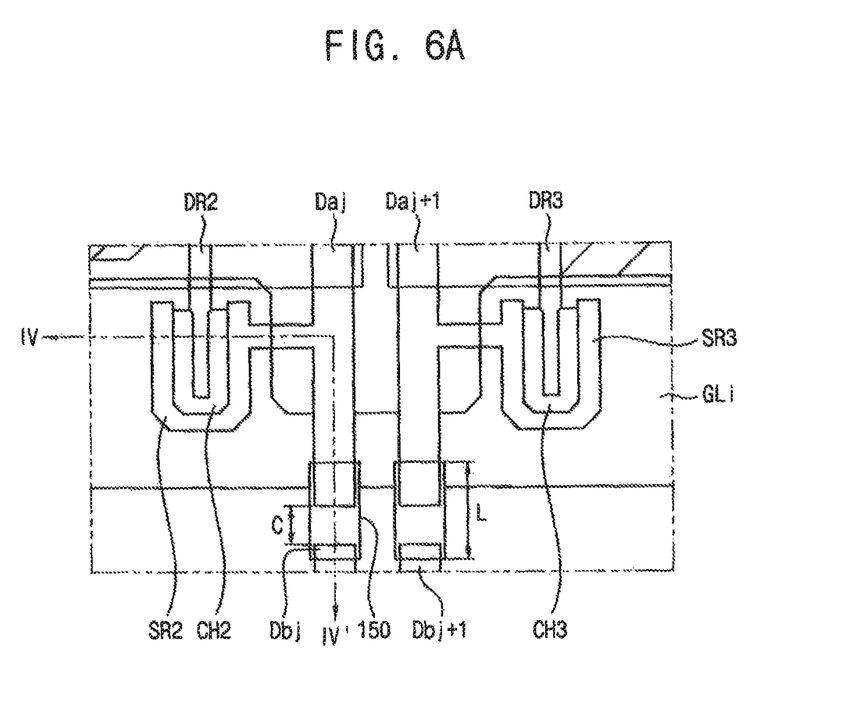
FIG. 6A is an enlarged plan view illustrating an array substrate according to an exemplary embodiment of the invention.
Figure 6B:
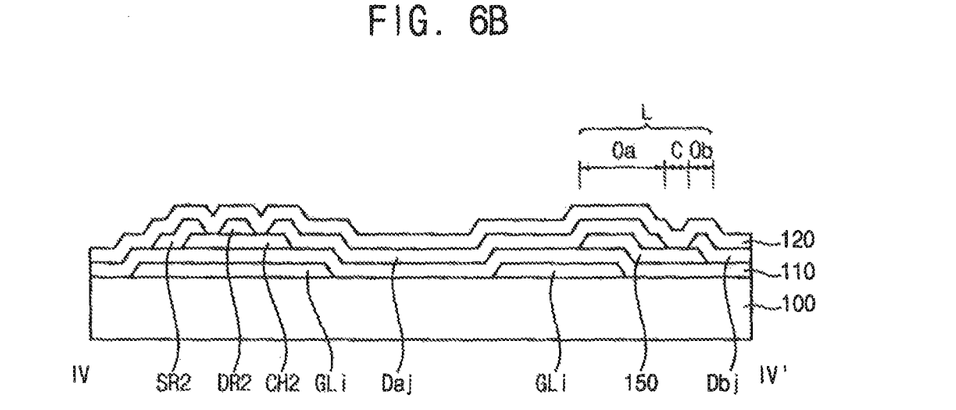
FIG. 6B is a cross-sectional view taken along a line IV-IV' of FIG. 6A according to an exemplary embodiment of the invention.

FIG. 6A is an enlarged plan view illustrating an array substrate according to an exemplary embodiment of the invention. FIG. 6B is a cross-sectional view taken along a line IV-IV' of FIG. 6A, according to an exemplary embodiment of the invention.

Referring to FIG. 2, FIG. 6A and FIG. 6B, an array substrate according to the present exemplary embodiment may include a substrate 100, a gate line GLi, a gate insulation layer 110, channel patterns CH2 and CH3, active patterns 150, source electrodes SR2 and SR3, drain electrodes DR2 and DR3, first data lines Daj and Daj+1 and second data lines Dbj and Dbj+1. Hereinafter, j-th data lines Daj and Dbj will be described for ease of description.

The second switching element TFT2 electrically connected to the j-th data line Daj of the first data lines may include the gate line GLi, the gate insulation layer 110, the channel pattern CH2, the source electrode SR2, the drain electrode DR2 and a passivation layer 120. The gate insulation layer 110 may be disposed on the gate line GLi. The channel pattern CH2 may be disposed on the gate insulation layer 110. The source electrode SR2 may partially overlap the channel pattern CH2. The drain electrode DR2 may be spaced apart from the source electrode SR2 and may partially overlap the channel pattern CH2. The passivation layer 120 may cover the source electrode SR2 and the drain electrode DR2.

The active pattern 150 may be disposed on the gate insulation layer 110 in a cutting portion which separates the first data line Daj and the second data line Dbj. The active pattern 150 may partially overlap the first data line Daj and the second data line Dbj. A first overlapping portion Oa of the first data line Daj may overlap the active pattern 150. A second overlapping portion Ob of the second data line Dbj may overlap the active pattern 150. The passivation layer 120 may cover the active pattern 150.

In the present exemplary embodiment, the active pattern 150 may be formed in a same layer as the channel pattern CH2. For example, the active pattern 150 may include the same material as the channel pattern CH2. The active pattern 150 may be formed simultaneously with the channel pattern CH2 using a single mask.

A length L of the active pattern 150 may be greater than a length of the cutting portion C between the first data line Daj and the second data line Dbj. For example, the length L of the active pattern 150 may be substantially the same as a sum of lengths of the first overlapping portion Oa, the second overlapping portion Ob and the cutting portion C.

The active pattern 150 may partially overlap the gate line GLi. The first overlapping portion Oa may partially overlap the gate line GLi. The second overlapping portion Ob may not overlap the gate line GLi.

In the present exemplary embodiment, the length of the first overlapping portion Oa may be greater than the length of the first overlapping portion Oa illustrated in FIG. 5A and FIG. 5B.

As mentioned above, the first data line Daj and the second data line Dbj separated by the cutting portion C may be electrically connected with each other through the active pattern 150, thereby reducing a difference in pixel signals applied to the pixel electrodes adjacent to the cutting portion C.

In addition, an overlapping area between the gate line GLi, the first data line Daj, the second data line Dbj and the active pattern 150 may be configured as described with reference to FIGS. 6A and 6B, thereby reducing the difference in pixel signals applied to the pixel electrodes adjacent to the cutting portion C.

Figure 7A:
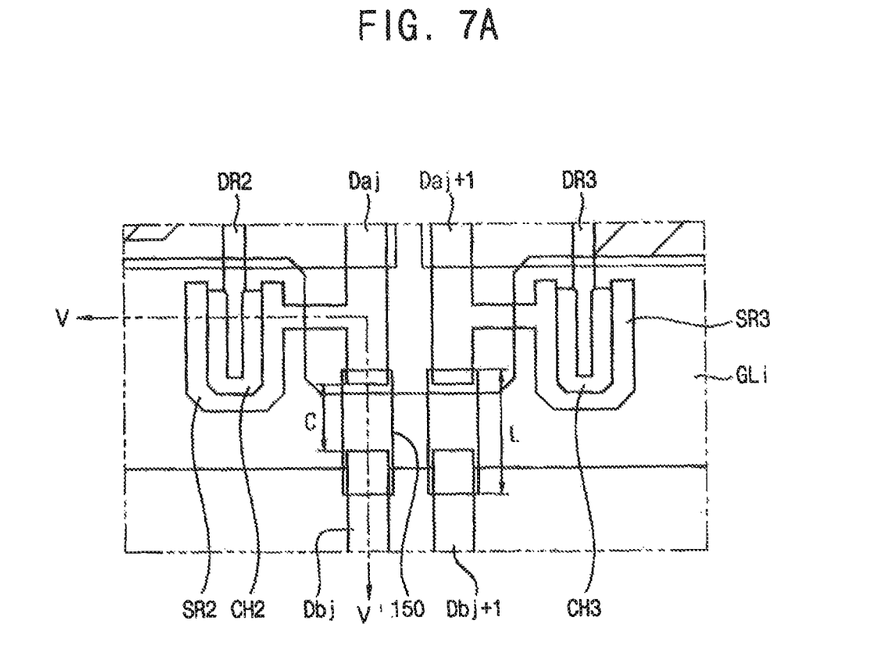
FIG. 7A is an enlarged plan view illustrating an array substrate according to an exemplary embodiment of the invention.
Figure 7B:
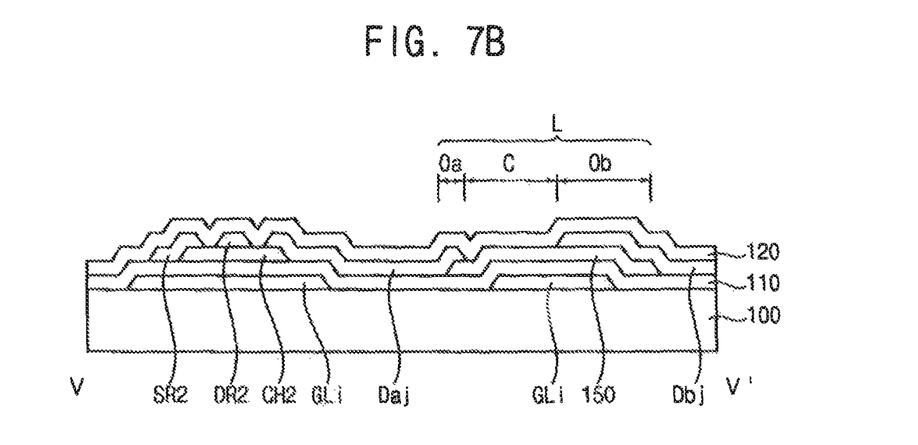
FIG. 7B is a cross-sectional view taken along a line V-V' of FIG. 7A according to an exemplary embodiment of the invention.

FIG. 7A is an enlarged plan view illustrating an array substrate according to an exemplary embodiment of the invention. FIG. 7B is a cross-sectional view taken along a line V-V' of FIG. 7A, according to an exemplary embodiment of the invention.

Referring to FIG. 2, FIG. 7A and FIG. 7B, an array substrate according to the present exemplary embodiment may include a substrate 100, a gate line GLi, a gate insulation layer 110, channel patterns CH2 and CH3, active patterns 150, source electrodes SR2 and SR3, drain electrodes DR2 and DR3, first data lines Daj and Daj+1 and second data lines Dbj and Dbj+1. Hereinafter, j-th data lines Daj and Dbj will be described for ease of description.

The second switching element TFT2 electrically connected to the j-th data line Daj of the first data lines may include the gate line GLi, the gate insulation layer 110, the channel pattern CH2, the source electrode SR2, the drain electrode DR2 and a passivation layer 120. The gate insulation layer 110 may be disposed on the gate line GLi. The channel pattern CH2 may be disposed on the gate insulation layer 110. The source electrode SR2 may partially overlap the channel pattern CH2. The drain electrode DR2 may be spaced apart from the source electrode SR2 and may partially overlap the channel pattern CH2. The passivation layer 120 may cover the source electrode SR2 and the drain electrode DR2.

The active pattern 150 may be disposed on the gate insulation layer 110 in a cutting portion which separates the first data line Daj and the second data line Dbj. The active pattern 150 may partially overlap the first data line Daj and the second data line Dbj. A first overlapping portion Oa of the first data line Daj may overlap the active pattern 150. A second overlapping portion Ob of the second data line Dbj may overlap the active pattern 150. The passivation layer 120 may cover the active pattern 150.

In the present exemplary embodiment, the active pattern 150 may be formed in a same layer as the channel pattern CH2. For example, the active pattern 150 may include the same material as the channel pattern CH2. The active pattern 150 may be formed simultaneously with the channel pattern CH2 using a single mask.

A length L of the active pattern 150 may be greater than a length of the cutting portion C between the first data line Daj and the second data line Dbj. For example, the length L of the active pattern 150 may be substantially the same as a sum of lengths of the first overlapping portion Oa, the second overlapping portion Ob and the cutting portion C.

The active pattern 150 may entirely overlap the gate line GLi. The length L of the active pattern 150 may be greater than a width of a portion of the gate line GLi which the data lines Daj and Dbj cross. The length L of the active pattern 150 may be greater than a width of the portion of the gate lines GLi which overlaps the active pattern 150.

The first overlapping portion Oa may not overlap the gate line GLi. The second overlapping portion Ob may partially overlap the gate line GLi.

As mentioned above, the first data line Daj and the second data line Dbj separated by the cutting portion C may be electrically connected with each other through the active pattern 150, thereby reducing a difference in pixel signals applied to the pixel electrodes adjacent to the cutting portion C.

In addition, an overlapping area between the gate line GLi, the first data line Daj, the second data line Dbj and the active pattern 150 may be configured as described with reference to FIGS. 7A and 7B, thereby reducing the difference in pixel signals applied to the pixel electrodes adjacent to the cutting portion C.

Figure 8A:
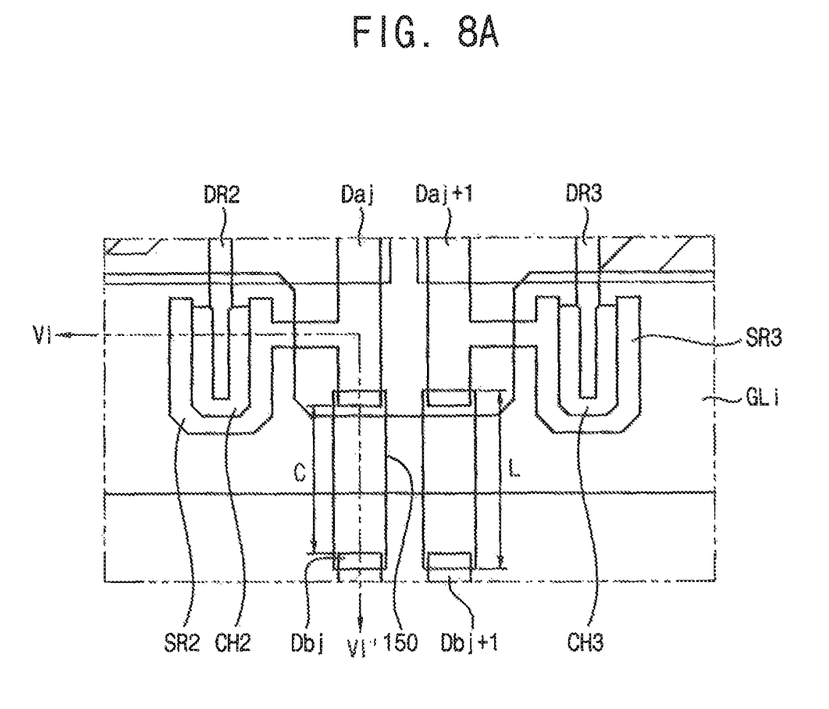
FIG. 8A is an enlarged plan view illustrating an array substrate according to an exemplary embodiment of the invention.
Figure 8B:
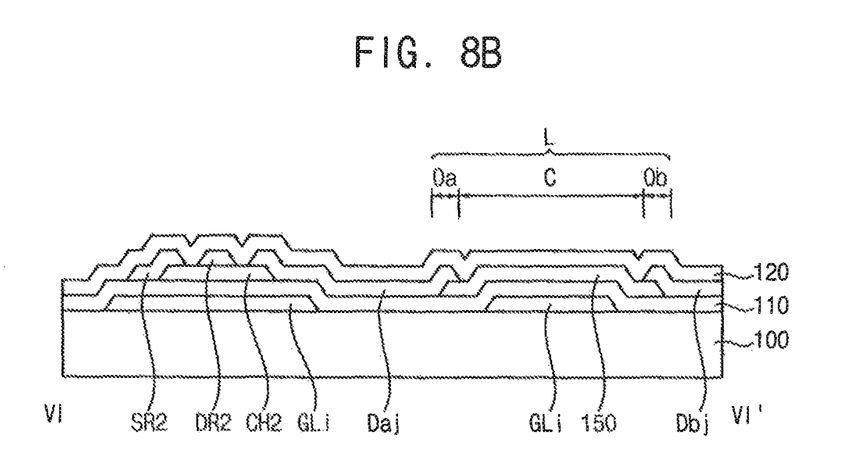
FIG. 8B is a cross-sectional view taken along a line VI-VI' of FIG. 8A according to an exemplary embodiment of the invention.

FIG. 8A is an enlarged plan view illustrating an array substrate according to an exemplary embodiment of the invention. FIG. 8B is a cross-sectional view taken along a line VI-VI' of FIG. 8A, according to an exemplary embodiment of the invention.

Referring to FIG. 2, FIG. 8A and FIG. 8B, an array substrate according to the present exemplary embodiment may include a substrate 100, a gate line GLi, a gate insulation layer 110, channel patterns CH2 and CH3, active patterns 150, source electrodes SR2 and SR3, drain electrodes DR2 and DR3, first data lines Daj and Daj+1 and second data lines Dbj and Dbj+1. Hereinafter, j-th data lines Daj and Dbj will be described for ease of description.

The second switching element TFT2 electrically connected to the j-th data line Daj of the first data lines may include the gate line GLi, the gate insulation layer 110, the channel pattern CH2, the source electrode SR2, the drain electrode DR2 and a passivation layer 120. The gate insulation layer 110 may be disposed on the gate line GLi. The channel pattern CH2 may be disposed on the gate insulation layer 110. The source electrode SR2 may partially overlap the channel pattern CH2. The drain electrode DR2 may be spaced apart from the source electrode SR2 and may partially overlap the channel pattern CH2. The passivation layer 120 may cover the source electrode SR2 and the drain electrode DR2.

The active pattern 150 may be disposed on the gate insulation layer 110 in a cutting portion which separates the first data line Daj and the second data line Dbj. The active pattern 150 may partially overlap the first data line Daj and the second data line Dbj. A first overlapping portion Oa of the first data line Daj may overlap the active pattern 150. A second overlapping portion Ob of the second data line Dbj may overlap the active pattern 150. The passivation layer 120 may cover the active pattern 150.

In the present exemplary embodiment, the active pattern 150 may be formed in a same layer as the channel pattern CH2. For example, the active pattern 150 may include the same material as the channel pattern CH2. The active pattern 150 may be formed simultaneously with the channel pattern CH2 using a single mask.

A length L of the active pattern 150 may be greater than a length of the cutting portion C between the first data line Daj and the second data line Dbj. For example, the length L of the active pattern 150 may be substantially the same as a sum of lengths of the first overlapping portion Oa, the second overlapping portion Ob and the cutting portion C.

In the present exemplary embodiment, the length of the cutting portion C may be greater than the length of the cutting portion C illustrated in FIG. 7A and FIG. 7B. For example, the length of the cutting portion C in the present exemplary embodiment may be equal to or less than about 70 μm.

The active pattern 150 may entirely overlap the gate line GLi. The length L of the active pattern 150 may be greater than a width of a portion of the gate line GLi which the data lines Daj and Dbj cross. The length L of the active pattern 150 may be greater than a width of the portion of the gate lines GLi which overlaps the active pattern 150.

The first overlapping portion Oa may not overlap the gate line GLi. In addition, the second overlapping portion Ob may not overlap the gate line GLi.

As mentioned above, the first data line Daj and the second data line Dbj separated by the cutting portion C may be electrically connected with each other through the active pattern 150, thereby reducing a difference in pixel signals applied to the pixel electrodes adjacent to the cutting portion C.

In addition, an overlapping area between the gate line GLi, the first data line Daj, the second data line Dbj and the active pattern 150 may be configured as described with reference to FIGS. 8A and 8B, thereby reducing the difference in pixel signals applied to the pixel electrodes adjacent to the cutting portion C.

Figure 9:
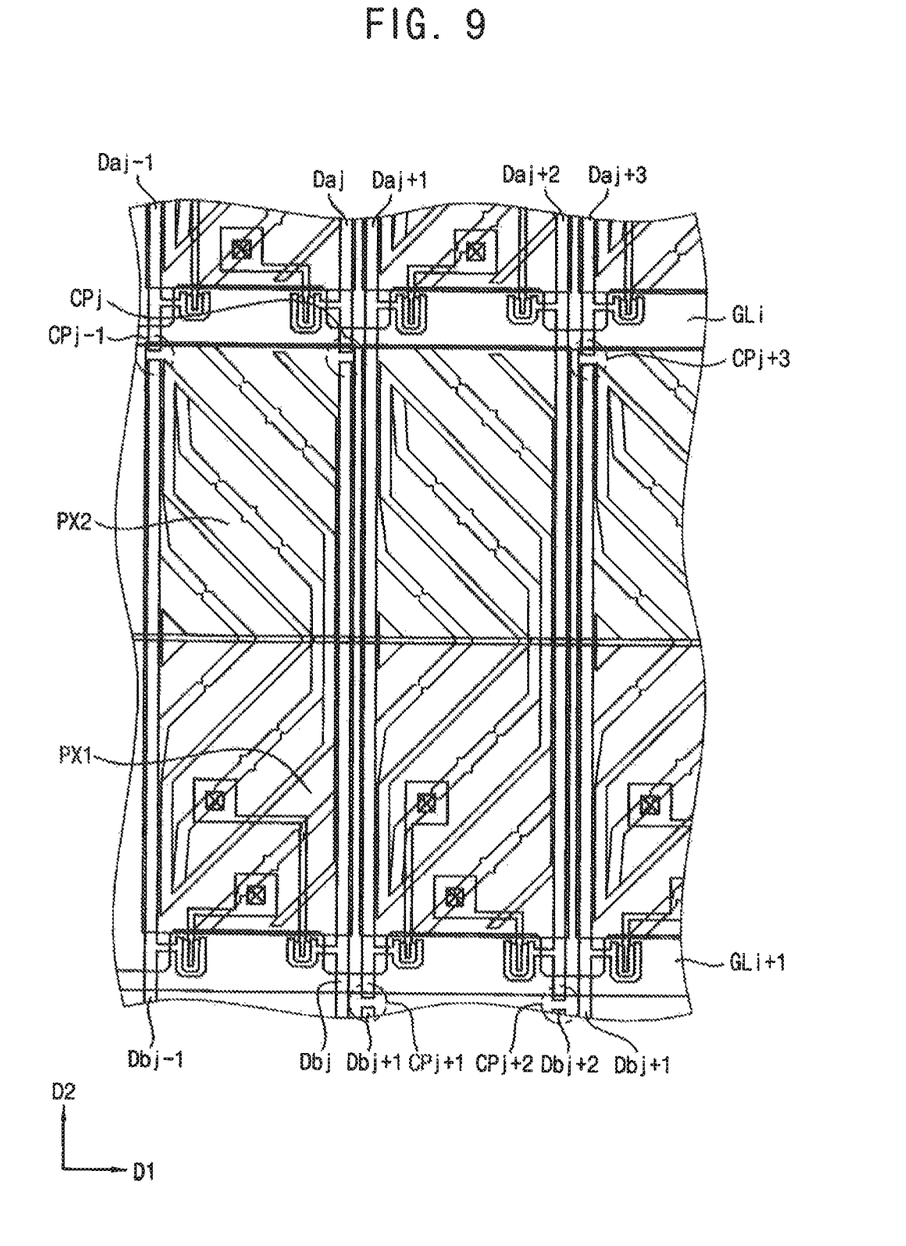
FIG. 9 is a plan view illustrating a portion of an array substrate according to an exemplary embodiment of the invention.

FIG. 9 is a plan view illustrating a portion of an array substrate according to an exemplary embodiment of the invention.

Referring to FIG. 9, an array substrate according to the present exemplary embodiment may include a plurality of gate lines GLi and GLi+1, a plurality of data lines Da and Db and a plurality of pixel electrodes PX1 and PX2. The gate lines GLi and GLi+1 may extend in a first direction D1. The data lines Da and Db may extend in a second direction D2 crossing the first direction D1. The pixel electrodes PX1 and PX2 may be electrically connected to the gate lines GL and the data lines Da and Db. The data lines Da and Db may include pairs of first data lines Da and second data lines Db separated by one of the gate lines GLi or GLi+1. For example, the pairs of the first data lines Da and the second data lines Db may be separated by cutting portions CPj−1 to CPj+3. Although active patterns are not illustrated in FIG. 9, the cutting portions CPj−1 to CPj+3 may overlap active patterns respectively, which electrically connect the first data line Da to the second data line Db.

In the present exemplary embodiment, the gate line which separates the first data line Da and the second data line Db may be different in the data lines Dj−1 to Dj+3 arranged in the first direction D1. For example, an i-th gate line GLi may separate both j−1-th data lines Daj−1 and Dbj−1 and j-th data lines Daj and Dbj. An i+1th gate line GLi+1 may separate both j+1-th data lines Daj+1 and Dbj+1 and j+2-th data lines Daj+2 and Dbj+2.

At least two pairs of the first data lines Da and the second data lines Db adjacent to each other in the first direction D1 (e.g., Dj−1 and Dj) may be separated by a single gate line e.g., GLi) of the gate lines.

At least two pairs of the first data lines Da and the second data lines Db adjacent to each other in the first direction D1

(e.g., Dj and Dj+1) may be separated by different gate lines (e.g., GLi and GLi+1) of the gate lines.

The active patterns 150 illustrated in FIG. 3A, FIG. 3B, FIG. 4A, FIG. 4B, FIG. 5A, FIG. 5B, FIG. 6A, FIG. 6B, FIG. 7A, FIG. 7B, FIG. 8A and FIG. 8B may be applied to the cutting portions CPj−1 to CPj+1 in the present exemplary embodiment.

For example, in FIG. 9, a width of an active pattern overlapping a cutting portion CPj−1 of the j−1-th data lines may be different from a width of an active pattern overlapping a cutting portion CPj of the j-th data lines. For example, in FIG. 9, a length of an active pattern overlapping the cutting portion CPj−1 of the j−1-th data lines may be different from a length of an active pattern overlapping the cutting portion CPj of the j-th data lines.

According to an exemplary embodiment of the invention, in the array substrate and the display device having the same, the first data line and the second data line separated by the cutting portion may be electrically connected with each other through the active pattern, thereby reducing a difference between pixel signals applied to the pixel electrodes adjacent to the cutting portion.

In addition, an overlapping area between the gate line, the first data line, the second data line and the active pattern may be variously configured by adjusting a distance between the first data line and the second data line, thereby reducing the difference in pixel signals applied to the pixel electrodes adjacent to the cutting portion.

Furthermore, a plurality of cutting portions may be arranged in different positions on the array substrate to form a bent line, thereby reducing an undesired horizontal line due to a straight-line arrangement of the cutting portions.

While the invention has been particularly shown and described with reference to exemplary embodiments thereof, it will be understood by those of ordinary skill in the art that various changes in form and detail may be made therein without departing from the spirit and scope of the invention as defined by the following claims.

What is claimed is:

1. An array substrate, comprising:
    a substrate;
    a plurality of gate lines extending in a first direction on the substrate;
    a plurality of data lines extending in a second direction and comprising first and second data line pairs separated by cutting portions, the second direction crossing the first direction; and
    a plurality of active patterns electrically connected to the first and second data line pairs, wherein the active patterns overlap a first gate line, and
    wherein the first data line or the second data line of one of the first and second data line pairs overlaps the first gate line.

2. The array substrate of claim 1, wherein in one of the first and second data line pairs, only one of the first data line or the second data line overlaps the first gate line.

3. The array substrate of claim 1, wherein a distance between the first data line and the second data line of one of the first and second data line pairs separated by one of the cutting portions is less than 70 μm.

4. The array substrate of claim 1, wherein a width of one of the active patterns in the first direction is greater than a width of one of the data lines in the first direction.

5. The array substrate of claim 1, wherein a length of one of the active patterns in the second direction is greater than a width of a portion of the first gate line crossing one of the data lines in the first direction.

6. The array substrate of claim 1, further comprising a plurality of pixel electrodes electrically connected to the gate lines and the data lines, wherein two data lines adjacent to each other in the first direction are electrically connected to different pixel electrodes in a pixel area between the two data lines.

7. The array substrate of claim 1, further comprising a plurality of thin film transistors electrically connected to the gate lines and the data lines,
    wherein at least one of the thin film transistors comprises:
        a source electrode electrically connected to the first data line or the second data line of one of the first and second data line pairs;
        a channel pattern overlapped by the source electrode on one of the gate lines; and
        a drain electrode overlapping the channel pattern.

8. The array substrate of claim 7, wherein the channel pattern is disposed in a same layer as one of the active patterns.

9. A display device, comprising:
    an array substrate comprising:
    a plurality of gate lines; and
    a plurality of data lines crossing the gate lines and comprising first and second data line pairs separated by cutting portions;
    a gate driving part configured to apply gate signals to the gate lines;
    a first data driving part configured to apply first data signals to the first data lines of the first and second data line pairs; and
    a second data driving part configured to apply second data signals to the second data lines of the first and second data line pairs,
    wherein the first data lines and the second data lines of the first and second data line pairs are electrically connected by active patterns, wherein a first active pattern is disposed between a first gate line and at least one of the first and second data lines of one of the first and second data line pairs.

10. The display device of claim 9, wherein the first data signals and the second data signals comprise synchronized data signals.

11. An array substrate, comprising:
    a first data line disposed on a substrate;
    a second data line disposed on the substrate;
    an active pattern disposed between the first and second data lines and electrically connecting the first and second data lines to each other,
    wherein the active pattern is overlapped by the first and second data lines and a space is formed between the first and second data lines on the active pattern.

12. The array substrate of claim 11, wherein a passivation layer is disposed in the space.

* * * * *